United States Patent
Otremba et al.

(10) Patent No.: US 9,786,584 B2
(45) Date of Patent: Oct. 10, 2017

(54) LATERAL ELEMENT ISOLATION DEVICE

(75) Inventors: Ralf Otremba, Kaufbeuren (DE); Josef Hoeglauer, Haimstetten (DE); Juergen Schredl, Mering (DE); Xaver Schloegel, Sachsenkam (DE); Klaus Schiess, Allensbach (DE)

(73) Assignee: Infineon Technologies AG, Neubiberg (DE)

( * ) Notice: Subject to any disclaimer, the term of this patent is extended or adjusted under 35 U.S.C. 154(b) by 419 days.

(21) Appl. No.: 13/602,597

(22) Filed: Sep. 4, 2012

(65) Prior Publication Data

US 2014/0063766 A1  Mar. 6, 2014

(51) Int. Cl.
  *H05K 7/00* (2006.01)
  *H01L 23/495* (2006.01)
  *H05K 1/18* (2006.01)
  *H01L 23/31* (2006.01)
  *H01L 23/373* (2006.01)
  *H01L 23/467* (2006.01)
  *H05K 1/02* (2006.01)

(52) U.S. Cl.
  CPC .... *H01L 23/49568* (2013.01); *H01L 23/3121* (2013.01); *H01L 23/3735* (2013.01); *H05K 1/0256* (2013.01); *H05K 1/181* (2013.01); *H01L 23/467* (2013.01); *H01L 2224/48091* (2013.01); *H01L 2224/48247* (2013.01); *H01L 2224/48472* (2013.01); *H01L 2224/73265* (2013.01); *H01L 2924/1301* (2013.01); *H01L 2924/181* (2013.01); *H05K 1/0209* (2013.01); *H05K 2201/2072* (2013.01)

(58) Field of Classification Search
  CPC ........... H01L 23/49568; H01L 23/3121; H01L 23/3735; H05K 1/181; H05K 1/0256; H05K 1/0209
  USPC ............................ 361/783, 679.01, 748, 760
  See application file for complete search history.

(56) References Cited

U.S. PATENT DOCUMENTS

| 5,629,835 A * | 5/1997 | Mahulikar .......... H01L 21/4828 174/252 |
| 6,232,177 B1 | 5/2001 | Chang et al. |
| 2006/0262261 A1* | 11/2006 | Takeda et al. ................ 349/130 |
| 2008/0093730 A1 | 4/2008 | Furuta |
| 2011/0101394 A1 | 5/2011 | McKenzie et al. |

FOREIGN PATENT DOCUMENTS

| CN | 1241297 | 1/2000 |
| CN | 101120446 | 2/2008 |
| GB | 1 152 293 | 5/1969 |

* cited by examiner

*Primary Examiner* — Tremesha S Willis
(74) *Attorney, Agent, or Firm* — Dicke, Billig & Czaja, PLLC

(57) ABSTRACT

Representative implementations of devices and techniques provide isolation between a carrier and a component mounted to the carrier. A multi-layer device having lateral elements provides electrical isolation at a preset isolation voltage while maintaining a preselected thermal conductivity between the component and the carrier.

25 Claims, 5 Drawing Sheets

LATERAL ELEMENT ISOLATION DEVICE

BACKGROUND

Electrical and electronic components tend to generate heat during operation. Oftentimes, the generated heat negatively affects the performance of the components, and may shorten the lifespan of the components as well. Accordingly, whether a component is enclosed in a package or mounted directly to a circuit board, it is desirable to conduct the generated heat away from the component as efficiently as possible. For example, some surfaces of the component or package may be metallic to improve thermal conductivity.

In some cases, insulating materials (such as a molding compound, for example) may be applied to a mating surface of a component or package to avoid shorting the component to a mounting surface, a heat sink, or the like. A particular thickness of the insulating material may be used to achieve a desired blocking or isolation voltage between the component and the mounting surface. In general, a greater isolation voltage is achieved by increasing the thickness of the insulating material.

However, the addition of the insulating material to the component or package often reduces the thermal performance of the component or package. The insulating material may have poor thermal conductive properties, for example. Additionally, an increase in the thickness of the insulating material can further reduce the capability of the component or package to dissipate generated heat. In other words, the thermal performance tends to be dependent on the electrical isolation voltage desired.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Figure 1:
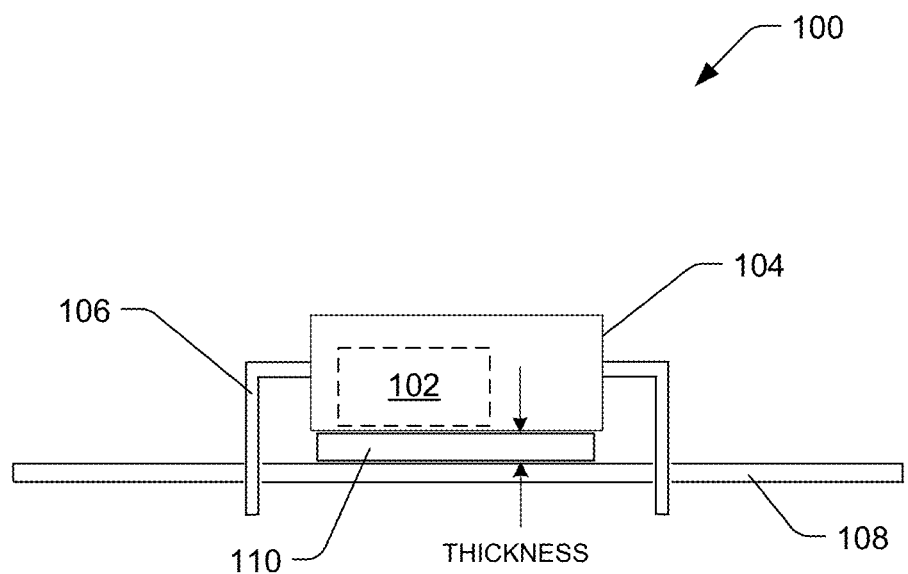
FIG. 1 is a profile view of an example electrical component, mounted within a package to a surface, and including an insulation layer, according to an implementation. The illustration of FIG. 1 represents an example environment wherein the techniques and devices discussed herein may be applied.

As electrical and electronic components generate heat during operation, it is desirable to conduct the generated heat away from the component as efficiently as possible. It is also frequently desirable to isolate the component from conductive surfaces, often at a preset blocking voltage. An isolation device is described that provides thermal conductive properties that are not dependent on a selected blocking voltage.

Representative implementations of devices and techniques provide isolation between a carrier and a component mounted to the carrier. A multi-layer isolation device having lateral elements provides electrical isolation at a preset isolation voltage while maintaining a preselected thermal conductivity between the component and the carrier.

In one implementation, a top conductive layer is arranged with respect to a bottom conductive layer such that a protrusion on a surface of the top layer is aligned with and facing a trough on a surface of the bottom layer. In one implementation, the top layer does not make contact with the bottom layer. In an implementation, an insulating third layer is located in the gap between the protrusion and the trough.

In alternate implementations, a thickness of the third layer and/or a dimension of the gap determines the electrical blocking voltage of the isolation device. For example, the blocking voltage may be based on the narrowest portion of the gap. In the implementations, the thermal performance of the isolation device is based on the overall thickness of the isolation device. In other implementations, the thermal performance may be based on the individual thicknesses (and associated thermal conductivities) of the layers of the isolation device.

In an implementation, the top and bottom layers of the isolation device include multiple protrusions each, where the protrusions are spaced a distance apart. Due to the spacing, multiple troughs are formed between the protrusions on each of the layers. In the implementation, the protrusions of each of the layers are aligned with the troughs of the opposite layer.

Various implementations and arrangements are discussed with reference to electrical and electronics components and varied carriers. While specific components are mentioned, this is not intended to be limiting, and is for ease of discussion and illustrative convenience. The techniques and devices discussed with reference to an isolation device are applicable to any type or number of discrete components (e.g., transistors, diodes, thyristors, etc.), circuits (e.g., integrated circuits, analog circuits, digital circuits, mixed circuits, etc.), groups of components, packaged components, structures, and the like. For ease of discussion, the generic terms "semiconductor device" and "component" are used synonymously herein to describe any of the above.

Further, the techniques and devices discussed with reference to an isolation device are applicable to any type of carrier (e.g., board, chip, wafer, substrate, printed circuit board (PCB), package, container, can, module, etc.). For ease of discussion, the generic term "carrier" is used herein.

Implementations are explained in more detail below using a plurality of examples. Although various implementations and examples are discussed here and below, further implementations and examples may be possible by combining the features and elements of individual implementations and examples.

Example Environment

FIG. 1 is a profile view of an example environment 100 of an example electrical component 102. The environment 100 represents an example environment wherein the techniques and devices discussed herein may be applied. The techniques, components, and devices described herein with respect to the environment 100 are not limited to the illustration in FIG. 1, and may be applied to other designs, types, and constructions without departing from the scope of the disclosure. In some cases, fewer, additional, or alternative components may be used to implement the techniques described herein.

In an implementation, as shown in FIG. 1, the component 102 may be enclosed within a package 104. In alternate implementations, the component 102 may be mounted to a different type of carrier (a back plane, for example), it may have an integrated carrier, or the like. In various implementations, the package 104 includes one or more electrical connections 106 arranged to couple the component 102 to other circuits and/or components. In some implementations, the connections 106 are also arranged to secure the package 104 to a mounting surface 108 (i.e., another type of carrier in some implementations).

The example component 102 (and the package 104) is shown insulated from the mounting surface 108 by an insulation layer 110, according to the implementation. In an implementation, the insulation layer 110 electrically isolates the component 102 from the surface 108. For example, the insulation layer 110 may provide an isolation or blocking voltage based on the thickness of the insulation layer 110. In alternate implementations, the insulation layer 110 may be comprised of any of various non-conductive materials, dielectric materials, and so forth.

In an implementation, the insulation layer 110 increasingly reduces the thermal conductivity of the component 102 to the surface 108 as the thickness of the insulation layer 110 increases. For example, a thinner insulation layer 110 of a given material generally has better heat conductivity than a thicker insulation layer 110 of the same material, and particularly with poorly-conducting materials.

Figure 2A:
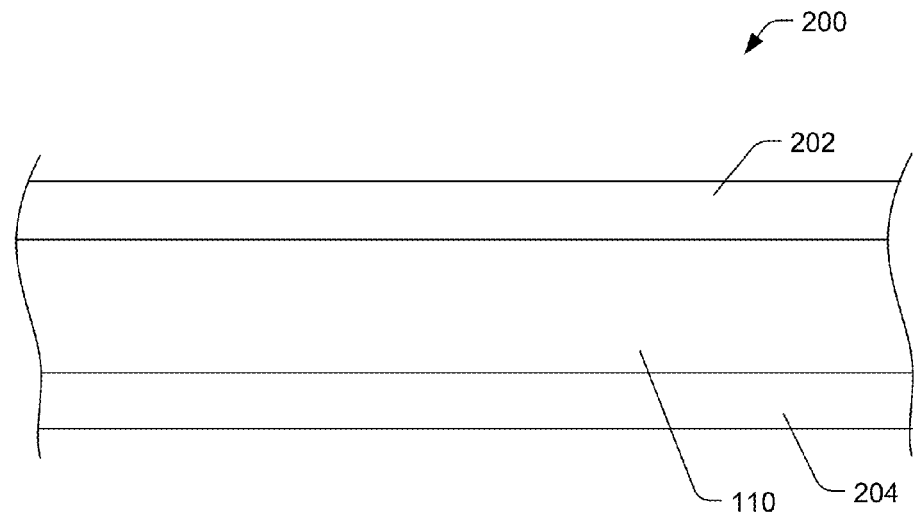
FIG. 2A is a profile view of a portion of an example insulation layer arrangement, as may be applied to the component of FIG. 1.

FIG. 2A is a profile view of a portion of an example insulation layer arrangement 200, as may be applied to the component 102 of FIG. 1, for example. As shown in FIG. 2A, an insulation layer arrangement 200 may be comprised of multiple layers. For example, the insulation layer arrangement 200 may include a first conductive layer 202, a second conductive layer 204, and a third layer—the insulation layer 110.

In an implementation, where the component 102 comprises a transistor, for example, the first conductive layer 202 may be the drain or collector contact for the transistor. In alternate implementations, the first conductive layer 202 may comprise another conductive contact or element of the component 102.

In an implementation, the second conductive layer 204 may be a conductive portion of the carrier, a conductive back plane, a conductive mounting surface (such as surface 108, for example), or the like. In one implementation, it is desirable to electrically isolate the first layer 202 from the second layer 204 by a preset blocking voltage.

In an implementation, the thickness of the third insulation layer 110 determines the isolation or blocking voltage as between the first and second conductive layers. In an implementation, the thicker the third insulation layer 110, the poorer the thermal conductivity of the insulation layer arrangement 200. In other words, when the insulation layer arrangement is used to provide voltage isolation for a component 102, the thermal performance (i.e., capability of the component 102 to dissipate generated heat) is dependent on the desired blocking voltage (including the thickness of the insulation layer 110).

Example Isolation Device

Figure 2B:
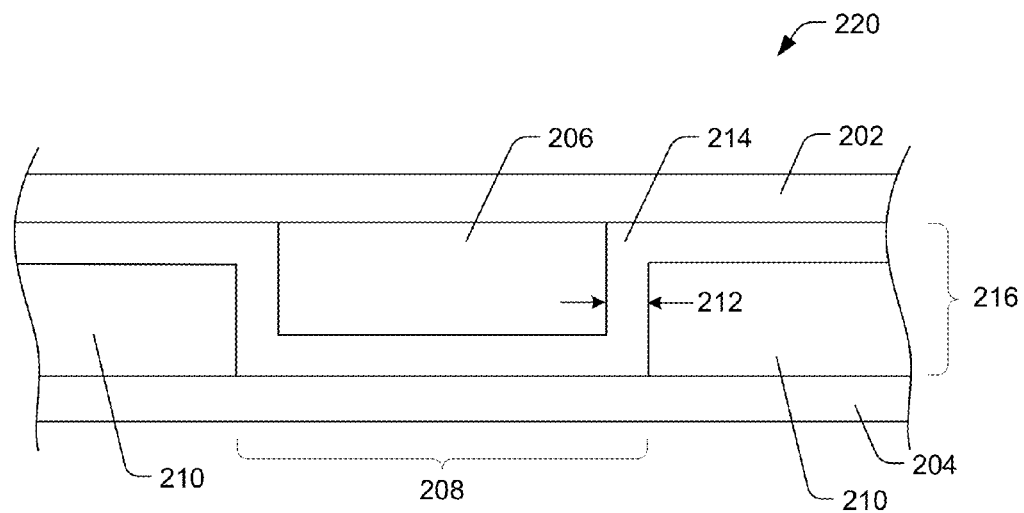
FIG. 2B is a profile view of a portion of an example isolation device having lateral elements, according to an implementation.

FIG. 2B is a profile view of a portion of an example isolation device 220, as may be applied to the component 102 of FIG. 1, for example. As shown in FIG. 2B, the isolation device 220 may be comprised of multiple layers and may have lateral elements, according to some implementations. In various implementations, the isolation device 220 may have fewer elements and layers than illustrated in the example of FIG. 2B, or it may have more or alternative elements and layers than those shown in FIG. 2B.

For example, the isolation device 220 may include the first conductive layer 202 and the second conductive layer 204. In an implementation, where the component 102 comprises a transistor, for example, the first conductive layer 202 may be the drain or collector contact for the transistor. In alternate implementations, the first conductive layer 202 may comprise another conductive contact or element of the component 102.

In an implementation, the second conductive layer 204 may be a conductive portion of the carrier, a conductive back plane, a conductive mounting surface (such as surface 108, for example), or the like.

In an implementation, the first layer 202 and/or the second layer 204 is electrically conductive and thermally conductive. In alternate implementations, one of the first layer 202 and the second layer 204 are electrically conductive without being thermally conductive or are thermally conductive without being electrically conductive.

In an alternate implementation, the first layer 202 and the second layer 204 are conductive layers that are integral to the isolation device 220. In such an implementation, one of the first 202 or second 204 layers are coupled to one or more portions of the component 102, and the other of the first 202 and second 204 layers are coupled to the carrier, for example.

In an implementation, the first layer 202 includes at least one protrusion 206 on a surface of the first layer 202. In alternate implementations, the protrusion 206 is coupled to the first layer 202 or is integral to the first layer 202. For example, in one implementation, the protrusion 206 may be electrically and/or physically coupled to the first layer 202. In the implementation, the protrusion 206 may be formed as a lateral layer, for example, as part of the isolation device 220. The protrusion 206 may be constructed of the same material as the first layer 202, for example, or be constructed of another conductive material. In another implementation, the protrusion 206 may be an integral part of the first layer 202 and continuous with the first layer 202. In the implementation, the protrusion 206 may be formed with the formation of the first layer 202, for example.

In an implementation, the second layer 204 includes at least one trough 208 on a surface of the second layer 204. In alternate implementations, the trough 208 results from one or more elements 210 coupled to the second layer 204 or is integral to the second layer 204. In an implementation, one or more of the elements 210 may comprise a protrusion 206. For example, in one implementation, the trough 208 may be electrically and/or physically coupled to the second layer 204. In the implementation, the trough 208 may be formed as one or more lateral layers, for example, as part of the isolation device 220. The trough 208 may be constructed of the same material as the second layer 204, for example, or be constructed of another conductive material. In another implementation, the trough 208 may be an integral part of the second layer 204 and continuous with the second layer 204. In the implementation, the trough 208 may be formed with the formation of the second layer 204, for example.

In various implementations, the protrusion 206 may comprise a bump, a rib, a ridge, a raised portion, a stripe, and the like. In the implementations, the protrusion 206 may have substantially straight segments, curved segments, a single segment, a single point, multiple segments, multiple points, irregular form, maze-like form, polygonal form, elliptical form, combinations of the foregoing, and the like. Further, the profile of the protrusion 206 may have an irregular shape, a polygonal shape, an elliptical shape, combinations of the foregoing, and the like.

In an implementation, the trough 208 has a complementary shape and profile to the protrusion 206, such that the protrusion 206 at least partially fits within the trough 208. In an implementation, the protrusion 206 extends partway into the trough 208, as shown in FIG. 2B. In an alternate implementation, the shape of the trough 208 does not fully match the shape of the protrusion 206, such that a portion of the protrusion 206 does not extend into the trough 208 and/or a portion of the trough 208 does not have a protrusion 206 extending into it.

In an implementation, as shown in FIG. 2B, the second layer 204 is arranged such that the trough 208 faces the protrusion 206 and the trough 208 is substantially aligned with the protrusion 206. In one implementation, the second layer 204 is substantially parallel to the first layer 202.

In one implementation, it is desirable to electrically isolate the first layer 202 from the second layer 204 by a preset blocking voltage. In an implementation, the preset blocking voltage is based on a dimension 212 of the gap between the protrusion 206 and the trough 208. For example, an increased blocking voltage results from a greater distance between the protrusion 206 and the trough 208, and a reduced blocking voltage results from a lesser distance between the protrusion 206 and the trough 208. In various implementations, the dimension 212 may be at various locations along the protrusion 206 and the trough 208. For example, the blocking voltage may be at the location along the protrusion 206 and the trough 208 where the dimension 212 is the least.

In an implementation, the electrical blocking voltage of the isolation device 220 is adjusted by adjusting a length of protrusion 206 or adjusting a depth of the trough 208. This in turn changes one or more of the dimensions (such as the dimension 212) of the gap between the protrusion 206 and the trough 208. In one implementation, the electrical blocking voltage is adjusted without changing a thickness of the isolation device 220 or a thermal conductivity of the isolation device 220.

In an implementation, the isolation device 220 includes an insulating third layer 214 located in the gap between the protrusion 206 and the trough 208. Based on the shape of the protrusion 206 and the trough 208, in various implementations, the insulating third layer 214 may have a corrugated profile, or the like. In alternate implementations, the insulating third layer 214 may be comprised of one or more segments of insulating material. For example, in one implementation, the insulating third layer 214 may be formed by a single layer disposed between the first 202 and second 204 layers. In another implementation, the insulating third layer 214 may be formed by multiple lateral and vertical segments or layers. In other words, the insulating third layer 214 may be formed by multiple segments or layers that are lateral to the first 202 and second 204 layers and multiple segments or layers that are parallel to the first 202 and second 204 layers.

In an implementation, the thickness dimension 212 of the gap (and the insulating third layer 214) between the protrusion 206 and the trough 208 is based on a desired electrical blocking voltage between the first layer 202 and the second layer 204. In one implementation, the desired electrical blocking voltage is determined by a thickness dimension of a lateral portion of the third layer 214.

In an implementation, a middle isolation section 216 comprises the protrusion 206, trough 208, and the insulating third layer 214. In one implementation, the middle isolation section 216 of the isolation device 220 is a stand-alone isolation device, to be implemented with a first layer 202 from a component 102 (such as the drain or collector contact, for example), and a second layer 204 from a carrier, or the like. In the implementation, the protrusion 206 electrically couples to one of the first layer 202 and the second layer 204 and the trough 208 electrically couples to the other of the first layer 202 and the second layer 204.

In various implementations, the thickness of the isolation device 220 (or the section 216) is based on a desired thermal conductivity of the isolation device 220 in combination with the thermal properties of the elements making up the isolation device 220 or the section 216. The thickness of the isolation device 220 includes a thickness of the first layer 202, a thickness of the second layer 204, a thickness of the third layer 214, and at least one of a length of the protrusion 206 and a depth of the trough 208. Alternately, the thickness of the section 216 includes a thickness of the third layer 214, and at least one of a length of the protrusion 206 and a depth of the trough 208.

In an implementation, the thickness of the isolation device (or the section 216) can remain constant, providing a substantially constant thermal conductivity, with variations in blocking voltage values. In other words, the thermal conductivity is not dependent on the blocking voltage. This is discussed further with regard to FIGS. 3A and 3B.

Figure 3A:
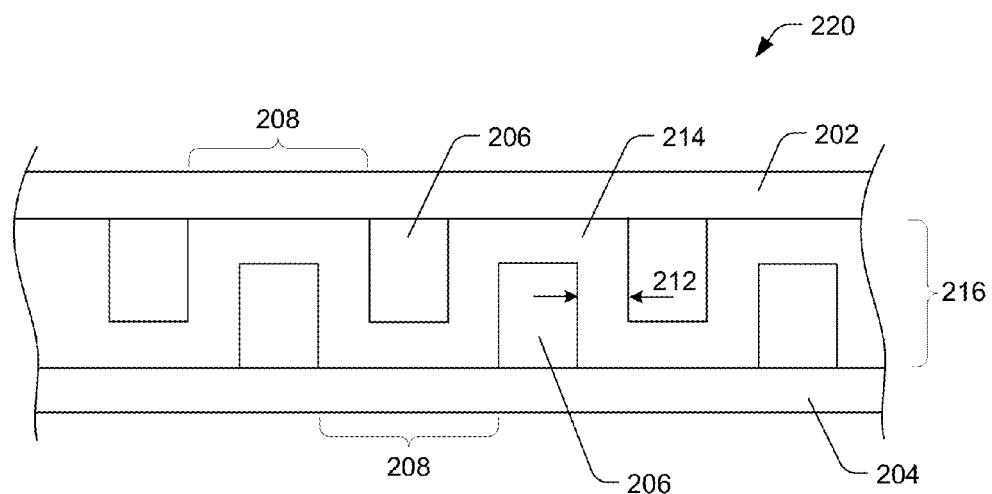
FIG. 3A is a profile view of a portion of another example isolation device, according to another implementation. The example isolation device of FIG. 3A is illustrated as intended for a greater isolation voltage application.
Figure 3B:
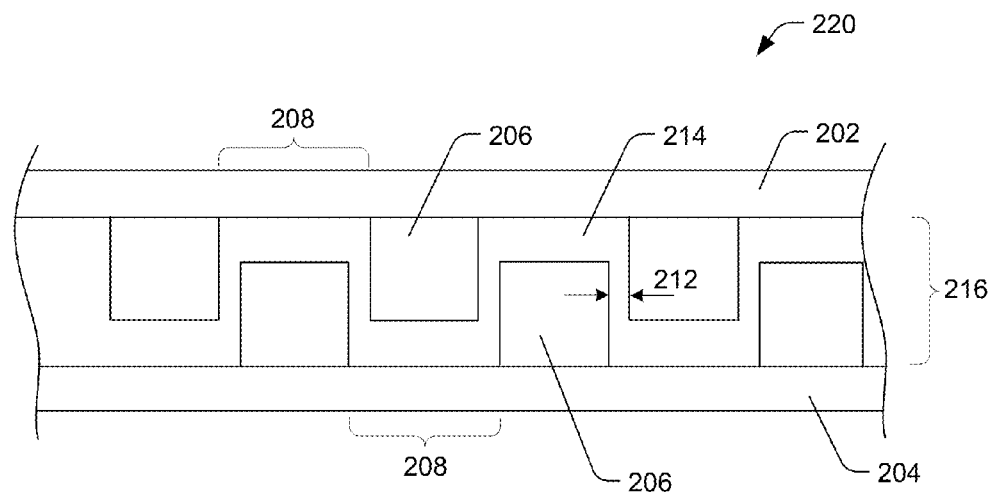
FIG. 3B is a profile view of a portion of a further example isolation device, according to a further implementation. The example isolation device of FIG. 3B is illustrated as intended for a lesser isolation voltage application.

FIGS. 3A and 3B are profile views of a portion of an example isolation device 220, according to two implementations. Both illustrations of the isolation device 220 show implementations having multiple protrusions 206 and multiple troughs 208.

In an implementation, the first layer 202 includes multiple protrusions 206 on the surface of the first layer 202 and the second layer 204 includes multiple protrusions 206 on the surface of the second layer 204. In the implementation, the multiple protrusions 206 on each of the layers are spaced apart so as to form multiple troughs 208 between the protrusions 206 on each of the layers (202, 204).

In the implementation, the insulating third layer 214 is located in a gap between the protrusions 206 and the troughs 208.

In an implementation, the second layer 204 is arranged in parallel to the first layer 202 such that the multiple protrusions 206 on the surface of the second layer 204 faces multiple troughs 208 between the multiple protrusions 206 on the surface of the first layer 202 and the multiple protrusions 206 on the surface of the first layer 202 faces multiple troughs 208 between the multiple protrusions 206 on the surface of the second layer 204. In various implementations, the protrusions 206 are aligned with troughs 208 on the opposite layer, and extend partially into the troughs 208 on the opposite layer.

In one implementation, as shown in FIGS. 3A and 3B, the multiple protrusions 206 on the surface of the first layer 202 are substantially parallel to the multiple protrusions 206 on the surface of the second layer 204. In an implementation, the protrusions 206 extend perpendicular (i.e., 90 degrees) from the respective layers (202, 204). In an alternate implementation, the protrusions 206 extend at some other angle (i.e., greater or less than 90 degrees) and the troughs 208 have a complementary angle to accept the protrusions 206.

In an alternate example, the middle section 216 may be formed by alternating lateral layers of conductive material and insulating material. For instance, lateral layers of insulating material may disposed between lateral layers of conductive material (forming the protrusions 206, for example), where the conductive material does not extend the full thickness of the section 216. Insulating material may be used to fill in the layer to the full thickness of the section 216. Each of the successive layers of conductive material may be electrically coupled in an alternating manner to the first layer 202 and the second layer 204, as shown in FIGS. 3A and 3B.

The example isolation device 220 of FIG. 3A is illustrated as intended for a greater isolation voltage application (10 kV, for example). This is shown by the larger dimension 212 in the gap between the protrusions 206 and the troughs 208. The example isolation device 220 of FIG. 3B is illustrated as intended for a lesser isolation voltage application (1 kV, for example). This is shown by the smaller dimension 212 in the gap between the protrusions 206 and the troughs 208.

In an implementation, the electrical isolation voltage (i.e., blocking voltage) as between the first layer 202 and the second layer 204 may be adjusted by changing one or more dimensions (such as dimension 212, for example) of the gap or a portion of the gap without changing a distance of the second layer 204 from the first layer 202. This may be accomplished by changing one or more dimensions of the protrusions 206 (e.g., a length, width, shape, etc.) and/or the troughs 208 (e.g., a depth, width, shape, etc.), for example. In this way, the isolation voltage may be adjusted without a substantial effect to the thermal performance of the isolation device 220. Accordingly, the isolation device 220 is scalable with respect to the isolation voltage for a preselected thermal conductivity.

Example Implementations

Figure 4:
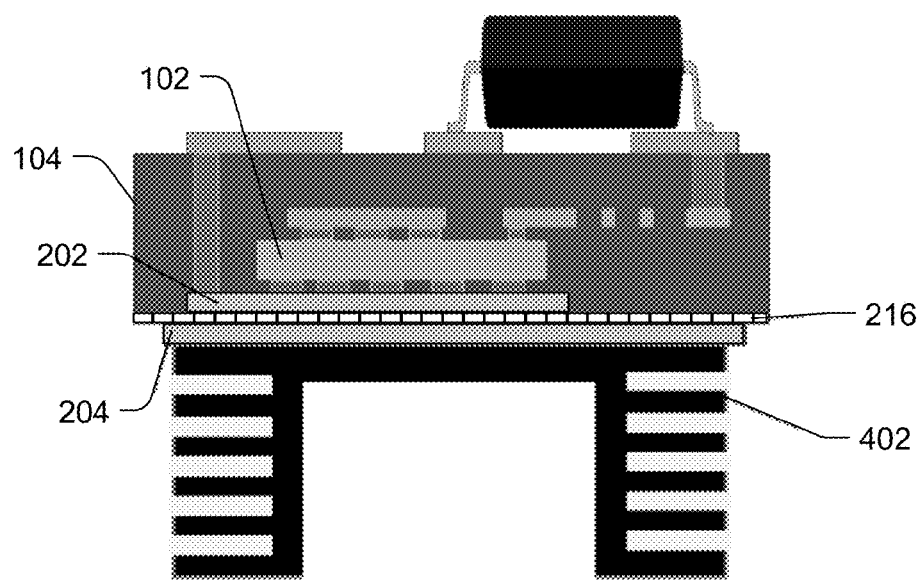
FIG. 4 shows illustrations of example applications of an isolation device, according to two example implementations. The top example shows an integrated circuit (IC) package mounted to a heat sink via an isolation device. The bottom example shows an implementation wherein an IC package is mounted to a printed circuit board (PCB) via an isolation device.
Figure 4:
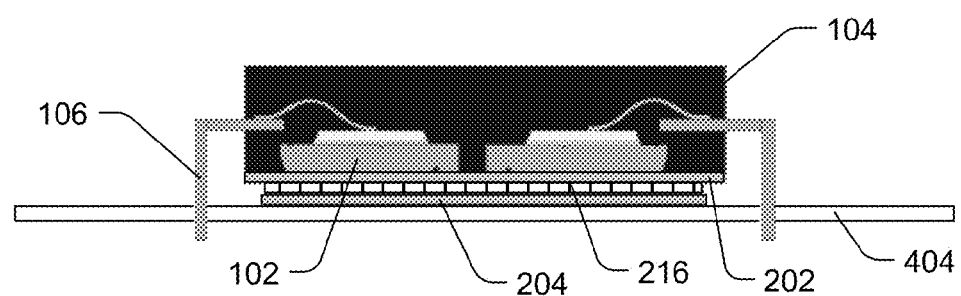

In various implementations, an isolation device 220 (or a middle section 216) may be employed with other devices and/or components to provide electrical isolation and thermal conductivity. FIG. 4 shows illustrations of example applications of an isolation device 220, according to two example implementations. Various other combinations and systems are also within the scope of the disclosure, in other implementations.

The top example of FIG. 4 shows a component 102 (e.g., a semiconductor device, a discrete component, an electrical circuit having multiple components, etc.) enclosed in an integrated circuit (IC) package 104 that is mounted to a heat sink 402 via an isolation device 220. As discussed above, the isolation device 220 comprises the first layer 202, the second layer 204, and the middle section 216. Also, the middle section 216 includes one or more protrusion(s) 206, one or more trough(s) 208, and a third insulating layer 214 located in the gap between the protrusion(s) 206 and the trough(s) 208, as discussed above.

In an implementation, as discussed above, the isolation device 220 provides electrical isolation between the component (e.g., semiconductor device) 102 and a carrier element at a preset isolation voltage. In the implementation, the isolation device 220 also provides a preselected thermal conductivity between the component (e.g., semiconductor device) 102 and the carrier element.

In the top example, the first layer 202 of the isolation device 220 may be coupled to the drain or collector of the component, or the first layer 202 may be the drain or collector connection of the component 102. Further, the second layer 204 may be coupled to a carrier element, or the second layer 204 may be an isolated metallic element (i.e., carrier) that may be electrically and thermally coupled to the heat sink 402.

In another implementation, the second layer 204 may be a part of the IC package 104. For example, the carrier for the component 102 may include the second layer 204 and encapsulation material, making up the IC package 104. In alternate implementations, for example, the carrier may be a metallic chip carrier or a ceramic chip carrier.

In alternate implementations, the isolation device 220 may be disposed inside the IC package 104 or outside the IC package 104. The location of the isolation device 220 may be determined by the composition of the package (e.g., metallic, ceramic, etc.) in some cases. For example, in one implementation, the isolation device 220 is disposed inside the IC package 104, and one of the first layer 202 or the second layer 204 is electrically coupled to at least one outside surface (the bottom surface, for example) of the IC package 104. In the top illustration of FIG. 4, the bottom layer 204 may be electrically coupled to the bottom surface of the IC package 104, for example. In one implementation, the bottom layer 204 may be the bottom surface of the IC package 104, for example. In that implementation, the bottom layer 204 may be coupled (at least thermally) to the heat sink 402.

In another example implementation, the isolation device 220 is disposed outside the IC package 104. In the implementation, at least a portion of the isolation device 220 (the first layer 202, for example) comprises at least one surface (the bottom surface, for example) or a portion of the surface of the IC package 104. For instance, the bottom surface of the IC package 104 may include the first layer 202, or the first layer 202 may be coupled to the bottom surface of the IC package 104.

While the top illustration shows a particular orientation of the IC package 104, the component 102, the heat sink 402, and the like, this is for illustration and not intended to be limiting. Other orientations, designs, constructions, and the like are also within the scope of the disclosure. The isolation device 220 may be used on a top side, back side, front side, etc. of an IC package 104 equally as well in alternate implementations having the other orientations, designs, constructions, and the like. The techniques and devices discussed are applicable in the alternate implementations in their respective forms. In some implementations, multiple isolation devices 220 or middle sections 216 may be used individually or in combinations.

The bottom example of FIG. 4 shows an implementation wherein an IC package 104 is mounted to a printed circuit board (PCB) 404 (i.e., carrier) via an isolation device 220. In an implementation, the PCB is equivalent to the surface 108 discussed with reference to FIG. 1. In alternate implementations, the PCB 404 is a substrate, wafer, chip surface, wiring board, and the like.

In one implementation, the isolation device 220 is coupled to the PCB 404. For example the PCB 404 may include one or more isolation devices 220, arranged for mounting components 102, packages 104, and the like. In alternate implementations, the isolation device 220 is coupled to (or integral with) the IC package 104 as described above, or is an independent device arranged to be used between the IC package 104 and the PCB 404.

Representative Process

Figure 5:
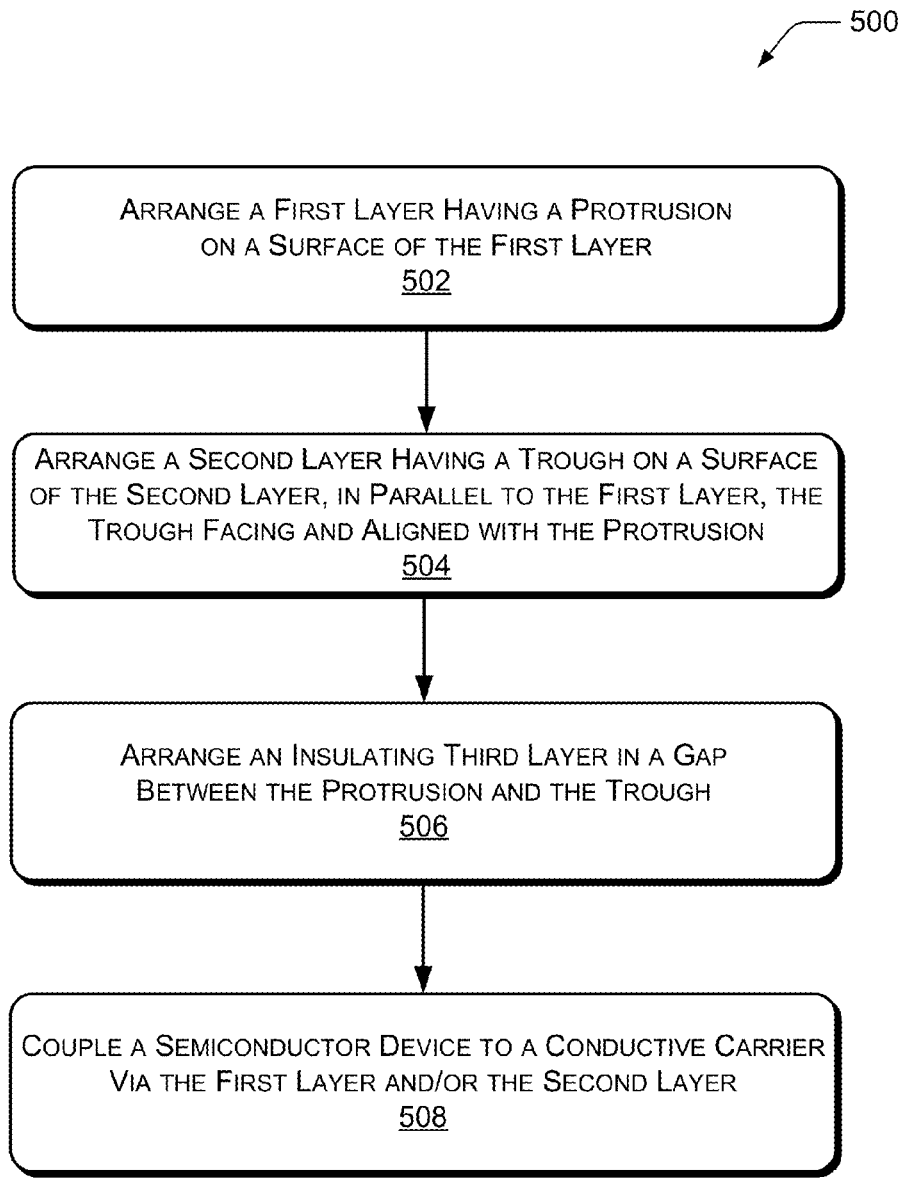
FIG. 5 is a flow diagram illustrating an example process for isolating a component from a conductive carrier, according to an implementation.

FIG. 5 illustrates a representative process 500 for isolating a component (such as component 102, for example) from a conductive surface or carrier, according to various implementations. An example process 500 includes electrically isolating the component from the carrier while maintaining a preselected thermal conductivity. In various implementations, a multi-layered section having lateral elements may be employed between the component and the surface or carrier. The process 500 is described with reference to FIGS. 1-4.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At block 502, the process includes arranging a conductive first layer (such as first layer 202, for example) having at least one protrusion (such as protrusion 206, for example) on a surface of the first layer.

At block 504, the process includes arranging a conductive second layer (such as second layer 204, for example) having at least one trough (such as trough 208, for example) on a surface of the second layer. In an implementation, the second layer is arranged in parallel to the first layer. In one example, the layers are arranged such that the at least one trough faces the at least one protrusion and the at least one trough is substantially aligned with the at least one protrusion.

At block 506, the process includes arranging an insulating third layer (such as third layer 214, for example) in a gap between the at least one protrusion and the at least one trough.

At block 508, the process includes coupling a semiconductor device (such as component 102, for example) to a conductive carrier via at least one of the first layer and the second layer of the isolation device. In other words, the isolation device is located between the semiconductor device and the carrier. In this way, the isolation device provides an isolation (or blocking) voltage between the semiconductor device and the carrier, and also maintains a thermal conductivity between the semiconductor device and the carrier. The semiconductor device is able to dissipate generated heat to the carrier independent of the desired isolation voltage.

In an implementation, the process includes adjusting a thermal conductivity of the semiconductor device to the carrier by changing a distance of the second layer from the first layer. For example, based on the materials of the isolation device, the thermal conductivity of the isolation device is dependent on the thickness of the isolation device. Generally, the thicker the isolation device (and particularly the insulting third layer or middle section) the poorer the thermal conductivity of the device.

In one implementation, the process includes adjusting the electrical isolation voltage between the first layer and the second layer by changing one or more dimensions of the gap without changing a distance of the second layer from the first layer. For example, one or more dimensions (length, width, depth, etc.) of the protrusion(s) and/or the trough(s) may be changed to change the isolation voltage level, without changing the distance between the first and second layers (i.e., without changing a thickness of the middle section). Changing one or more dimensions of the protrusion(s) or the trough(s) changes one or more dimensions of the gap. In an implementation, since the protrusion(s) and the trough(s) are electrically coupled to the first and second layers, the isolation voltage is based on a smallest dimension of the gap.

In an example, changing the one or more dimensions of the gap includes changing the thickness of at least a portion of the insulating third layer. In one implementation, the insulating third layer fills the gap between the protrusion(s) and the trough(s). Accordingly, changing a dimension of the gap changes a dimension of the third layer. In an alternate implementation, the third layer may not fully fill the gap. For instance, vacuum may be present in the gap as well. In another implementation, the third layer may be comprised at least partly of air, another gas, or combinations of multiple elements.

In alternate implementations, other techniques may be included in the process 500 in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A device, comprising:
a conductive first layer having at least one protrusion on a surface of the first layer, the at least one protrusion comprising conductive material;
a conductive second layer having at least one trough on a surface of the second layer, the second layer arranged such that the at least one trough faces the at least one protrusion and the at least one trough is substantially aligned with the at least one protrusion, and wherein the at least one protrusion is at least partially positioned within the trough; and
an insulating third layer located in a gap between the at least one protrusion and the at least one trough, the insulating third layer disposed adjacent at least three distinct surfaces of at least one of the at least one protrusion.

2. The device of claim 1, the first layer further comprising multiple protrusions on the surface of the first layer and the second layer further comprising multiple protrusions on the surface of the second layer, the second layer arranged in parallel to the first layer such that the multiple protrusions on the surface of the second layer faces multiple troughs between the multiple protrusions on the surface of the first layer and the multiple protrusions on the surface of the first layer faces multiple troughs between the multiple protrusions on the surface of the second layer; the insulating third layer located in a gap between the protrusions and the troughs.

3. The device of claim 2, wherein the multiple protrusions on the surface of the first layer are substantially parallel to the multiple protrusions on the surface of the second layer.

4. The device of claim 1, wherein a thickness of the device is based on a desired thermal conductivity of the device, and includes a thickness of the first layer, a thickness of the second layer, a thickness of the third layer, and at least one of a length of the protrusion and a depth of the trough.

5. The device of claim 1, wherein a thickness dimension of the gap is based on a desired electrical blocking voltage between the first layer and the second layer.

6. The device of claim 5, wherein the first layer is parallel to the second layer and the third layer includes a portion that is lateral to the first and second layers, the desired electrical blocking voltage determined by a thickness dimension of the lateral portion of the third layer.

7. The device of claim 1, wherein an electrical blocking voltage of the device is adjusted by adjusting a length of the at least one protrusion or adjusting a depth of the at least one trough.

8. The device of claim 7, wherein the electrical blocking voltage is adjusted without changing a thickness of the device or a thermal conductivity of the device.

9. The device of claim 1, wherein at least one of the first layer and the second layer is electrically conductive and thermally conductive.

10. A system, comprising:
a carrier element arranged to support a semiconductor device; and
an isolation device coupled to the carrier element and arranged to isolate the semiconductor device from the carrier element, the isolation device including:
a conductive first layer having at least one protrusion on a surface of the first layer, the at least one protrusion comprising conductive material;
a conductive second layer having at least one trough on a surface of the second layer, the second layer arranged in parallel to the first layer such that the at least one trough faces the at least one protrusion and the at least one trough is substantially aligned with the at least one protrusion, and wherein the at least one protrusion is at least partially positioned within the trough; and
an insulating third layer located in a gap between the at least one protrusion and the at least one trough, the insulating third layer disposed adjacent at least three distinct surfaces of at least one of the at least one protrusion.

11. The system of claim 10, wherein the carrier element includes an integrated circuit (IC) package arranged to contain the semiconductor device.

12. The system of claim 11, wherein the isolation device is disposed outside the IC package, at least a portion of the isolation device comprising at least one surface of the IC package.

13. The system of claim 11, wherein the isolation device is disposed inside the IC package, one of the first layer or the second layer electrically coupled to at least one outside surface of the IC package.

14. The system of claim 10, wherein the carrier element comprises one of a printed circuit board (PCB) or a semiconductor substrate.

15. The system of claim 10, wherein the isolation device provides electrical isolation between the semiconductor device and the carrier element at a preset isolation voltage.

16. The system of claim 10, wherein the isolation device provides a preselected thermal conductivity between the semiconductor device and the carrier element.

17. The system of claim 10, wherein the first layer or the second layer comprises at least one of a collector or a drain of the semiconductor device.

18. The system of claim 10, wherein the semiconductor device includes an electrical circuit comprised of multiple components.

19. A method, comprising:
arranging a conductive first layer having at least one protrusion on a surface of the first layer, the at least one protrusion comprising conductive material;
arranging a conductive second layer having at least one trough on a surface of the second layer, the second layer arranged in parallel to the first layer such that the at least one trough faces the at least one protrusion and the at least one trough is substantially aligned with the at least one protrusion, and wherein the at least one protrusion is at least partially positioned within the trough;
arranging an insulating third layer in a gap between the at least one protrusion and the at least one trough, the insulating third layer disposed adjacent at least three distinct surfaces of at least one of the at least one protrusion; and
coupling a semiconductor device to a conductive carrier via at least one of the first layer and the second layer.

20. The method of claim 19, further comprising adjusting a thermal conductivity of the semiconductor device to the carrier by changing a distance of the second layer from the first layer.

21. The method of claim 19, further comprising adjusting an electrical isolation voltage between the first layer and the second layer by changing one or more dimensions of the gap without changing a distance of the second layer from the first layer.

22. The method of claim 21, wherein changing the one or more dimensions of the gap includes changing a thickness of at least a portion of the insulating third layer.

23. An electrical component, comprising:
a carrier for a semiconductor device;
an isolation device coupled to the carrier, the isolation device including:
a conductive first layer having multiple protrusions on the surface of the first layer, at least one of the multiple protrusions comprising conductive material, the conductive first layer laterally extending beyond at least a first surface and a second surface of at least one of the multiple protrusions;
a conductive second layer having multiple protrusions on the surface of the second layer, the second layer arranged in parallel to the first layer such that the multiple protrusions on the surface of the second layer faces multiple troughs between the multiple protrusions on the surface of the first layer and the multiple protrusions on the surface of the first layer faces multiple troughs between the multiple protrusions on the surface of the second layer, and wherein the at least one protrusion of the multiple protrusions is at least partially positioned within a trough of the multiple troughs;

an insulating third layer located in a gap between the protrusions and the troughs, the insulating third layer disposed adjacent at least three distinct surfaces of at least one of the multiple protrusions on the surface of the first layer; and the semiconductor device coupled to the isolation device.

24. The electrical component of claim 23, wherein the carrier comprises one of a metallic chip carrier and a ceramic chip carrier.

25. The electrical component of claim 23, wherein the carrier comprises an integrated circuit (IC) package, and the isolation device is coupled to at least one of a top side and a bottom side of the IC package.

\* \* \* \* \*